United States Patent [19]
Gardner et al.

[11] Patent Number: 5,786,256
[45] Date of Patent: *Jul. 28, 1998

[54] METHOD OF REDUCING MOS TRANSISTOR GATE BEYOND PHOTOLITHOGRAPHICALLY PATTERNED DIMENSION

[75] Inventors: Mark I. Gardner, Cedar Creek; Fred N. Hause; H. Jim Fulford, Jr., both of Austin, all of Tex.

[73] Assignee: Advanced Micro Devices, Inc.

[*] Notice: This patent issued on a continued prosecution application filed under 37 CFR 1.53(d), and is subject to the twenty year patent term provisions of 35 U.S.C. 154(a)(2).

[21] Appl. No.: 684,407

[22] Filed: Jul. 19, 1996

[51] Int. Cl.$^6$ .................... H01L 21/336; H01L 21/3205
[52] U.S. Cl. ............................... 438/305; 438/585
[58] Field of Search ................... 437/40, 41, 44; 438/305, 585

[56] References Cited

U.S. PATENT DOCUMENTS

| | | | |
|---|---|---|---|
| 5,231,038 | 7/1993 | Yamaguchi et al. | 437/40 GS |
| 5,374,575 | 12/1994 | Kim et al. | 437/41 CS |
| 5,429,956 | 7/1995 | Shell et al. | 437/41 CS |
| 5,434,093 | 7/1995 | Chau et al. | |
| 5,449,094 | 9/1995 | Hsu | 437/44 |
| 5,472,897 | 12/1995 | Hsu et al. | 437/44 |
| 5,534,447 | 7/1996 | Hong | 437/44 |
| 5,538,913 | 7/1996 | Hong | 437/44 |

FOREIGN PATENT DOCUMENTS 44 15 137 C  7/1995  Germany.

OTHER PUBLICATIONS

Ghandhi, Sorab K. "VLSI Fabrication Principles Silicon and Gallium Arsenide", Second Edition, John Wiley & Sons, Inc., p. 649, 1994.

Wolf, Stanley "Silicon Processing For the VLSI Era vol. 2: Process Integration", Lattice Press, pp. 516–520, 1990.

"Additive Process for Making Small Polisilicon Gates," Research Disclosure by Meinrad Renner, No. 305, Sep. 1, 1989, p. 644.

International Search Report for PCT/US 97/08728 dated Sep. 24, 1997.

*Primary Examiner*—John Niebling
*Assistant Examiner*—Michael S. Lebentritt
*Attorney, Agent, or Firm*—Kevin L. Daffer; Conley, Rose & Tayon

[57] ABSTRACT

A semiconductor fabrication process for fabricating MOS transistors in which dielectric spacer structures are used prior to gate formation to reduce the gate length below the minimum feature size resolvable by the photolithography equipment. A semiconductor substrate having a channel region laterally disposed between a pair of source/drain regions is provided. A dielectric stack is formed on an upper surface of the semiconductor substrate and patterned to expose an upper surface of a spacer region of the semiconductor substrate. The spacer region includes the channel region and peripheral portions of the pair of source/drain regions proximal to the channel region. The patterning of the dielectric stack results in the formation of a pair of opposing sidewalls in the dielectric stack. Thereafter, a pair of first spacer structures are formed on the pair of opposing sidewalls such that the pair of first spacer structures cover or shadow the peripheral portions of the source/drain regions and such that an upper surface of the channel region is exposed. A gate structure is then formed on the upper surface of the channel region. The gate structure is laterally disposed between the pair of first spacer structures. A first dopant species is then introduced into the source/drain regions of the semiconductor substrate.

18 Claims, 4 Drawing Sheets

METHOD OF REDUCING MOS TRANSISTOR GATE BEYOND PHOTOLITHOGRAPHICALLY PATTERNED DIMENSION

BACKGROUND OF THE INVENTION

1. Field of the Invention

This invention relates to the field of semiconductor processing and, more particularly, to a method of forming a transistor gate having a critical dimension less than the minimum feature resolvable by the photolithography equipment used to make the transistor.

2. Description of the Relevant Art

The operating characteristics of transistors fabricated with metal-oxide-semiconductor (MOS) integrated circuit techniques are a function of the transistor's dimensions. In particular, the source-to-drain current ($I_{ds}$) is proportional to the ratio of the transistor's width (W) to the transistor's length (L). For given transistor width and a given biasing condition (e.g. $V_G$=3V, $V_D$=3V, and $V_s$=0V), $I_{ds}$ is maximized by minimizing the transistor length L. Minimizing transistor channel length also improves the speed of integrated circuits comprised of a large number of individual transistors because the larger drain current associated with a short channel length can drive the adjoining transistors into saturation more quickly. Minimizing L is, therefore, desirable from an device operation standpoint. In addition, minimizing the transistor length L is desirable from a manufacturing perspective because a smaller area of silicon is required to manufacture a transistor having a smaller length. By minimizing the area required for a given transistor, the number of transistors available for a given area of silicon increases and with it, a corresponding increase in the circuit complexity that can be achieved on the given area of silicon.

The main limitation of minimum device size in a semiconductor process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleighs criteria defines two images as being resolvable when the intensity between them drops to 80% of the image intensity. This criteria is satisfied when the 2d=0.61λ/NA. Where 2d is the separation distance of two images, λ is the wavelength of the energy source, and NA is the numerical aperature of the lens.

Commercially available optical photolithography machines are almost universally equipped with mercury vapor lamps as the illumination source. The characteristic energy spectrum of a mercury vapor lamp contains several distinct peaks in the 300 nm to 450 nm wavelength range. These peaks are commonly referred to by their industry designations. The peak associated with a wavelength of ~450 nm is designated the "G-line," the ~405 nm peak the "H-line," and the ~370 nm peak the "I-line." Optical aligners are similarly designated such that it is common to speak of "G-line aligners." The minimum feature size resolvable by a G-line aligner is greater than the minimum feature size of an I-line aligner because of the longer G-line wavelength.

As process technologies approach and surpass the resolvable limits of G-line aligners, semiconductor manufacturers are forced to implement alternative photolithography techniques to achieve adequate resolution of the minimum features. Unfortunately, the conventional alternatives involve abandoning or substantially modifying the existing photolithography equipment at a prohibitive cost. Many wafer fabrication facilities, for example, have extensive capital investment in G-line aligners. To adequately resolve features in the submicron range, it is typically necessary to upgrade these aligners so that they can operate in the I-line region or abandon the optical alignment equipment entirely and replace it with advanced lithography equipment including e-beam or x-ray lithography. The cost associated with replacing or upgrading G-line photolithography equipment can be staggering. In addition to the capital required to purchase and install the improved equipment, there are extensive costs associated with qualifying the new equipment for production worthiness and training production and maintenance personnel in the operation and care of the new equipment. Therefore, it is highly desirable to implement a manufacturing process that can extend the useful life of existing photolithography equipment by permitting the reproduceable fabrication of transistors having critical dimensions that are smaller than the minimum resolvable feature of the photolithography equipment.

SUMMARY OF THE INVENTION

The problems noted above are in large part addressed by a method of fabricating transistors in which dielectric spacer structures are used prior to gate formation to reduce the gate length below the minimum feature size resolvable by the photolithography equipment.

Specifically, a dielectric stack formed on an upper surface of the semiconductor substrate is patterned to expose a first region of the semiconductor substrate. Spacer structures are then formed on sidewalls of the patterned dielectric layer to cover or shadow peripheral regions of the exposed substrate. The region of the substrate which remains exposed after the formation of the spacers will, therefore, have their lateral dimension that is less than the lateral dimension separating the sidewalls. If the dielectric stack is patterned with a photolithography process such that the sidewalls are separated by a lateral distance approximately equal to the minimum resolvable feature size of the photolithography equipment, the region of the semiconductor substrate remaining exposed after formation of the spacer structures will have a lateral dimension that is less than the minimum dimension resolvable by the photolithography equipment. Thereafter, a gate structure can be formed laterally disposed between the spacer structures such that the gate structure has a minimum dimension below a minimum dimension resolvable by the photolithography equipment. In this manner, fabrication of transistors having critical dimensions previously thought unobtainable with conventional photolithography equipment is possible.

Broadly speaking, the present invention contemplates a semiconductor fabrication process in which a semiconductor substrate having a channel region laterally disposed between a pair of source/drain regions is provided. A dielectric stack is formed on an upper surface of the semiconductor substrate and patterned to expose an upper surface of a spacer region of the semiconductor substrate. The spacer region includes the channel region and peripheral portions of the pair of source/drain regions proximal to the channel region. The patterning of the dielectric stack results in the formation of a pair of opposing sidewalls in the dielectric stack. Thereafter, a pair of first spacer structures are formed on the pair of opposing sidewalls such that the pair of first spacer structures cover or shadow the peripheral portions of the source/drain regions and such that an upper surface of the channel region is exposed. A gate structure is then formed on the upper surface of the channel region. The gate structure is laterally disposed between the pair of first spacer structures. A first dopant species is then introduced into the source/drain regions of the semiconductor substrate.

Preferably, the dielectric stack is formed by depositing an oxide layer on an upper surface of the semiconductor substrate and thereafter depositing a silicon nitride layer on the oxide layer. In this embodiment, the step of introducing the first dopant species into the source/drain regions includes the steps of removing the silicon nitride layer, preferably with a 85% phosphoric solution at 120° C., and implanting ions into the pair of source/drain regions. In the preferred embodiment, the step of patterning the dielectric stack includes depositing a photoresist layer on the dielectric stack, providing an optical aligner capable of resolving a minimum dimension, selectively exposing the photoresist layer to form an exposed region having a lateral dimension approximately equal to the minimum dimension of the optical aligner. Preferably, the exposed region of the photoresist layer is laterally aligned with the spacer region.

The exposed region of the photoresist layer is then removed to expose an upper surface of the dielectric stack and, thereafter, portions of the dielectric stack within the spacer region are removed. In the presently preferred embodiment, the formation of the first spacer structures includes depositing a conformal spacer material preferably CVD oxide formed from a TEOS source and anisotropically etching a spacer material to clear the spacer material over planar regions of the dielectric stack with a minimum overetch. In an embodiment of the present invention, the gate structure is formed by forming a gate dielectric, such as a thin thermal oxide film, on an upper surface of the semiconductor substrate. The gate dielectric layer is laterally disposed between the first spacer structures.

A gate conductive layer preferably including a heavily doped polysilicon having a sheet resistivity less than 500 Ω/sq. is then blanket deposited on a topology defined by upper surfaces of the dielectric stack, the first spacer structures, and the gate dielectric. Thereafter, the gate conductive layer is planarized preferably with a chemical-mechanical polish such that an upper surface of the gate conductive layer is substantially coplanar with an upper surface of the dielectric stack. The gate conductive layer may be thermally oxidized to form a thermal oxide film at an upper surface of the gate conductive layer. The introduction of the first dopant species into the semiconductor substrate can be accomplished with or without LDD structures. In an embodiment in which LDD implants are not used, the introduction of the first dopant species into the semiconductor substrate is preferably accomplished by simply removing an upper portion of the dielectric stack and implanting ions such as boron, phosphorus, or arsenic, into the source/drain regions. In an LDD embodiment, the introduction of the first dopant species includes removing a dielectric stack, removing the pair of first spacer structures from the sidewalls of the gate structure, and implanting a first concentration of a first dopant species into the pair of source/drain regions. Thereafter, a pair of second spacer structures is formed on the sidewalls of the gate structure and a second concentration of ions is implanted. In a preferred embodiment, the first concentration of ions is substantially contained above a first depth below the upper surface of the semiconductor substrate while the second concentration of ions is substantially contained above a second depth below the upper surface of the semiconductor substrate. Preferably, the first concentration is less than the second concentration and the first depth is less than the second depth.

BRIEF DESCRIPTION OF THE DRAWINGS

Other objects and advantages of the present invention will become apparent upon reading the following detailed description and upon reference to the accompanying drawings in which.

Figure 1:
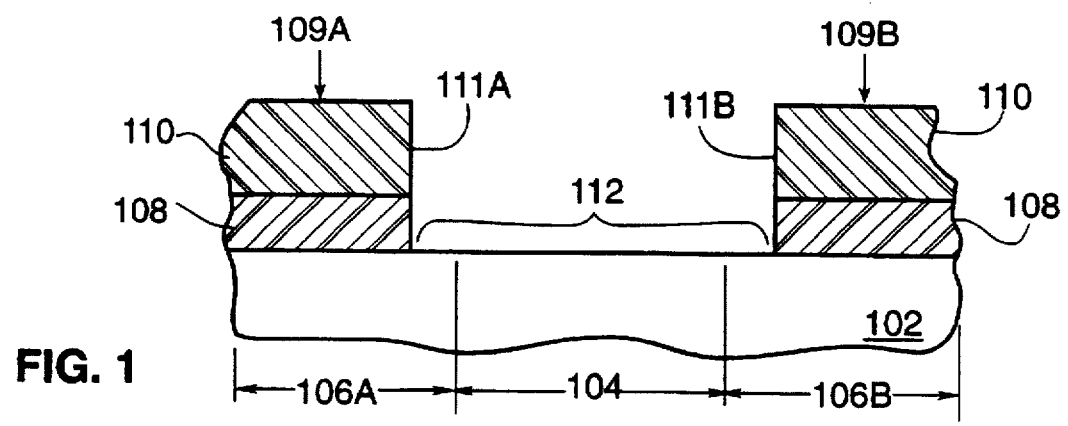
FIG. 1 is a partial cross-sectional view of a patterned dielectric stack formed upon an upper surface of a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

FIG. 1 is a partial cross-sectional view of semiconductor substrate 102. Semiconductor substrate 102 includes channel region 104 laterally disposed between a pair of source/drain regions 106a and 106b. In a process sequence not shown in the figures, a dielectric stack 109 is formed on semiconductor substrate 102. In a presently preferred embodiment, dielectric stack 109 includes an oxide layer 108 formed on an upper surface of semiconductor substrate 102 and a silicon nitride layer 110 formed on an upper surface of oxide layer 108. Preferably, both oxide layer 108 and silicon nitride layer 110 are formed in a chemical vapor deposition chamber according to processes well known in the art of semiconductor fabrication. In alternative embodiments not shown in the figures, dielectric stack 109 may be comprised of other dielectric material. Dielectric stack 109 may, for example, be comprised entirely of oxide, entirely of oxynitride, or may comprise a combination of oxide, nitride, oxynitride, as well as other dielectric materials suitable for the present process sequence.

Figure 12:
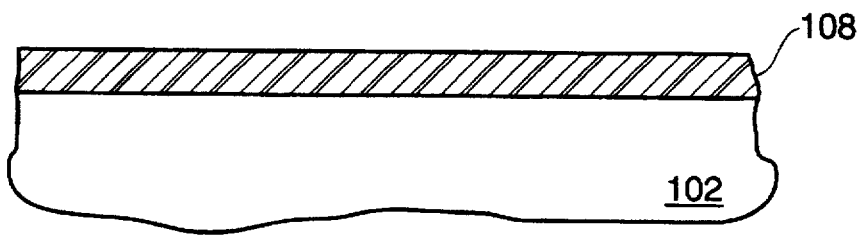
FIG. 12 is a partial cross-sectional view of a semiconductor substrate upon which a dielectric layer has been formed.
Figure 13:
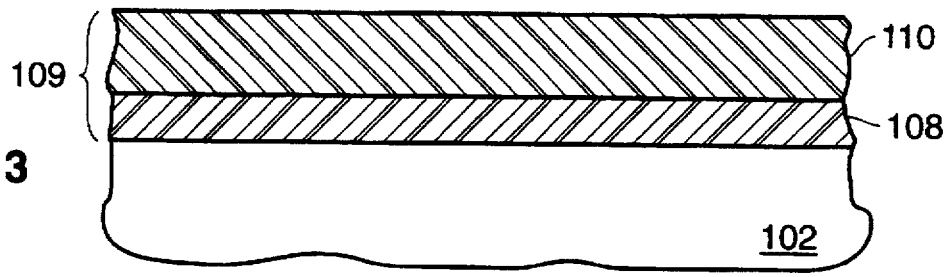
FIG. 13 is a processing step subsequent to FIG. 12 in which a silicon nitride layer is deposited upon the oxide layer.

After the formation of dielectric stack 109 upon semiconductor substrate 102, the dielectric stack is patterned to expose spacer region 112 of semiconductor substrate 102. FIGS. 12–15 depict a presently preferred process sequence for forming and patterning dielectric stack 109. FIG. 12 shows semiconductor substrate 102 upon which dielectric layer 108 has been formed. Preferably, dielectric layer 108 comprises an oxide formed in a chemical vapor deposition reactor using a silane or TEOS source. In the preferred embodiment, dielectric layer 108 is 20–100 nm thick. FIG. 13 shows a subsequent processing step in which a second dielectric layer 110 is formed on an upper surface of dielectric layer 108. Preferably, second dielectric layer 110 comprises silicon nitride at a thickness of approximately 50–150 nm. The chemical vapor deposition of silicon dioxide and silicon nitride are well known in the field of semiconductor fabrication and are described in 1 S. Wolf and R. N. Tauber, Silicon Processing for the VLSI Era, pp. 161–197 (Lattice Press 1986), which is incorporated herein by reference. First dielectric layer 108 and second dielectric layer 110 comprise dielectric stack 109. It is to be understood, however, that dielectric stack 109 may take alternative forms. Dielectric stack 109 may, for example, be comprised entirely of an oxide film, an oxynitride film, a combination of oxide, silicon nitride and silicon oxynitride, and other dielectric compositions compatible with the process flow hereof.

Figure 14:
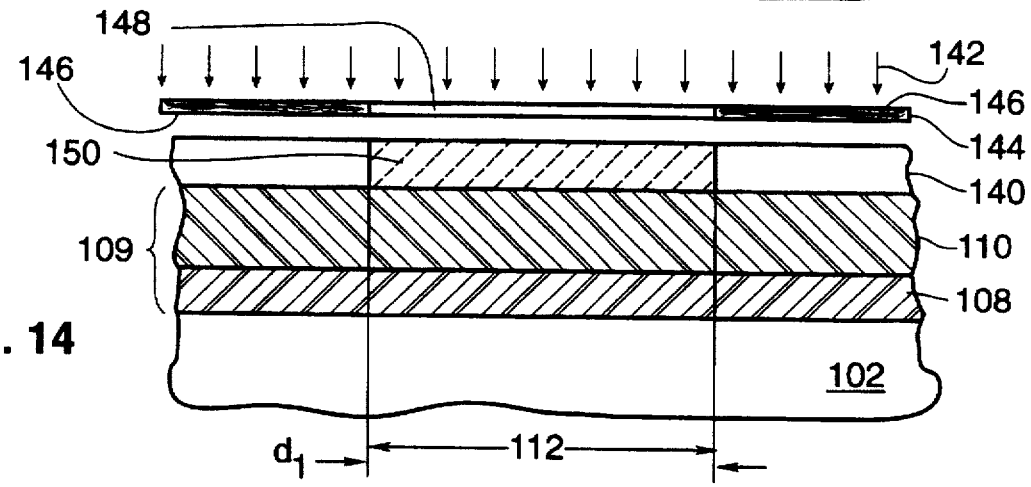
FIG. 14 is a processing step subsequent to FIG. 13 in which a photoresist layer deposited on the silicon nitride layer is selectively exposed with a radiation source and a photomask.

Turning to FIG. 14, a photoresist layer 140 is deposited upon an upper surface of dielectric stack 109. Photoresist layer 140 is thereafter selectively exposed to radiation 142, preferably emanating from an optical aligner photolithography apparatus, and photomask 144 comprising transmissive region 148 and opaque regions 146. This photo process results in exposed region 150 within photoresist layer 140. In the preferred embodiment, exposed region 150 is laterally aligned with spacer region 112 of silicon substrate 102.

Figure 15:
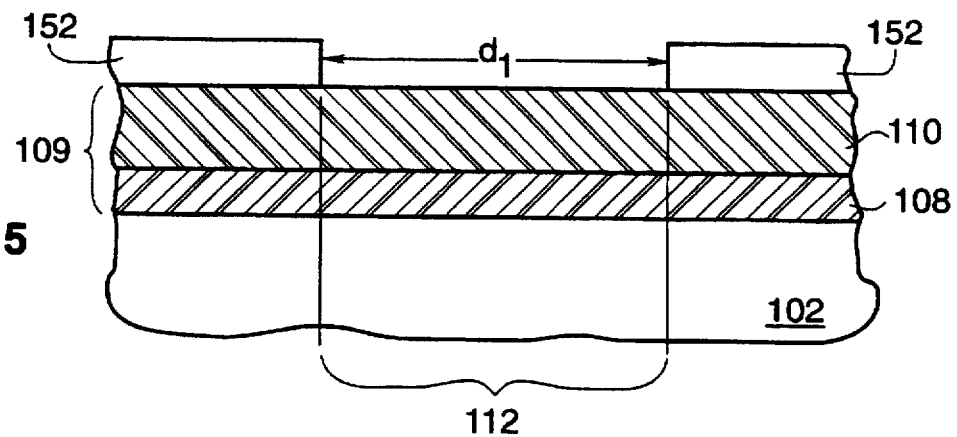
FIG. 15 is a processing step subsequent to FIG. 14 in which the exposed region of the photoresist layer has been removed.

Exposed region 150 of photoresist layer 140 preferably has a horizontal dimension d1 approximately equal to a minimum dimension resolvable by the photolithography apparatus (not shown in the figure). In FIG. 15, exposed region 150 of photoresist layer has been removed to form patterned photoresist layer 152. Patterned photoresist layer 152 exposes an upper surface of dielectric stack 109. The exposed region of dielectric stack 109 is aligned with spacer region 112 and has a horizontal dimension d1 approximately equal to the minimum feature resolvable by the photolithography apparatus. Returning to FIG. 1, the portions of dielectric stack 109 within the lateral boundaries of spacer region 112 are removed, preferably with a dry etch process, such that an upper surface of spacer region 112 is exposed. This patterning of dielectric step 109 results in formation of opposing sidewalls 111a and 111b.

Figure 2:
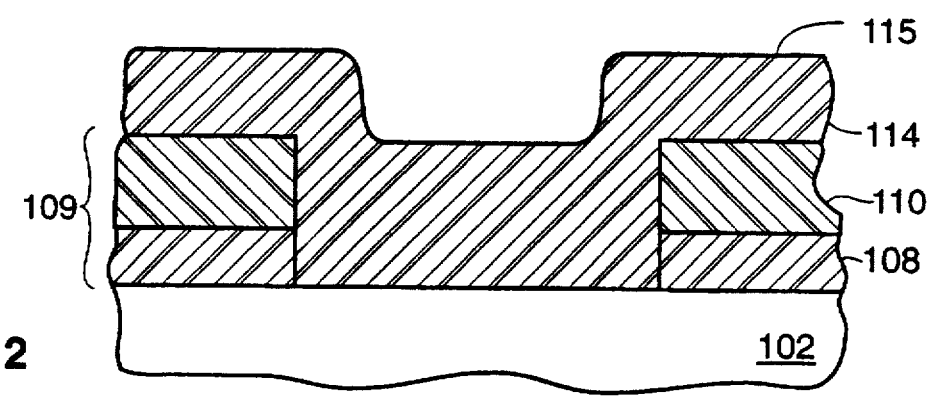
FIG. 2 is a processing step subsequent to FIG. 1 in which a spacer material has been blanket deposited.
Figure 3:
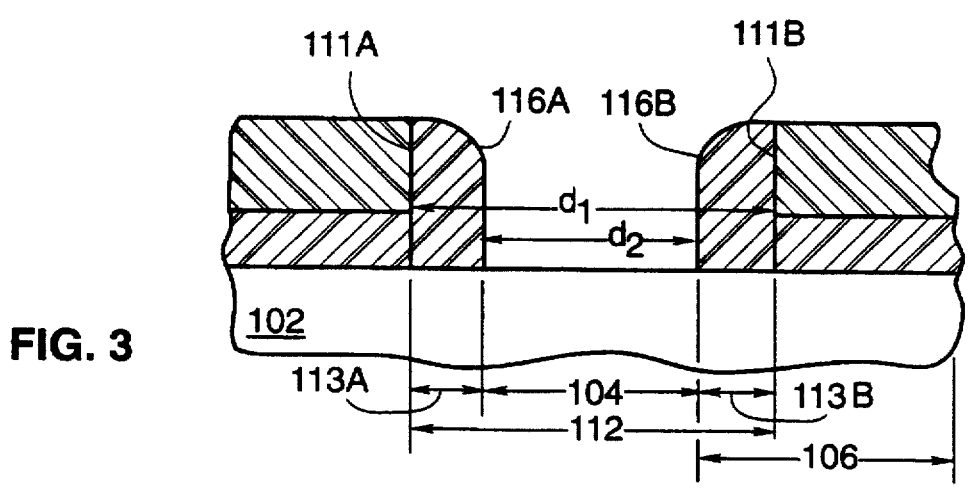
FIG. 3 is a processing step subsequent to FIG. 2 in which the spacer material has been etched leaving spacer structures formed on sidewalls of the patterned dielectric stack.

Turning now to FIG. 2, spacer material 114 is blanket deposited upon patterned dielectric stack 109 and semiconductor substrate 102. In the presently preferred embodiment, spacer material 114 comprises a CVD oxide film. Turning to FIG. 3, a pair of first spacers 116a and 116b are formed on the pair of opposing sidewalls 111a and 111b, respectively. First spacers 116 shadow peripheral portions 113 of source/drain regions 106. The formation of spacers 116 is preferably accomplished by anisotropically etching spacer material 114 until all spacer material 114 is removed from planar regions 115 with minimum overetch. The formation of spacer structures such as spacer structures 116 are well known in the semiconductor fabrication field, most notably in conjunction with the formation of lightly doped drains (LDDs) and a process for forming such structures is described in 3 S. Wolf, Silicon Processing for the VLSI Era, pp. 595–598 (Lattice Press 1995), incorporated herein by reference. Spacer structures 116 shadow peripheral portions 113 of source/drain regions 106 while an upper surface of channel region 104 of semiconductor substrate 102 remains exposed. As seen in FIG. 3, spacer region 112 includes peripheral regions 113a and 113b and channel region 104 of semiconductor substrate 102. In an embodiment in which spacer region 112 has a lateral dimension equal to minimum dimension d1 of the photolithography equipment, channel region 104 has a lateral dimension d2 which is less than minimum dimension d1.

Figure 4:
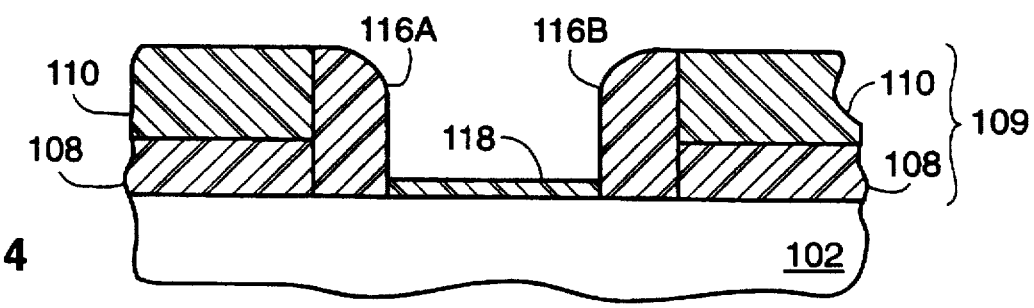
FIG. 4 is a processing step subsequent to FIG. 3 in which a gate dielectric layer has been formed on an upper surface of the semiconductor substrate laterally disposed between the spacer structures.
Figure 5:
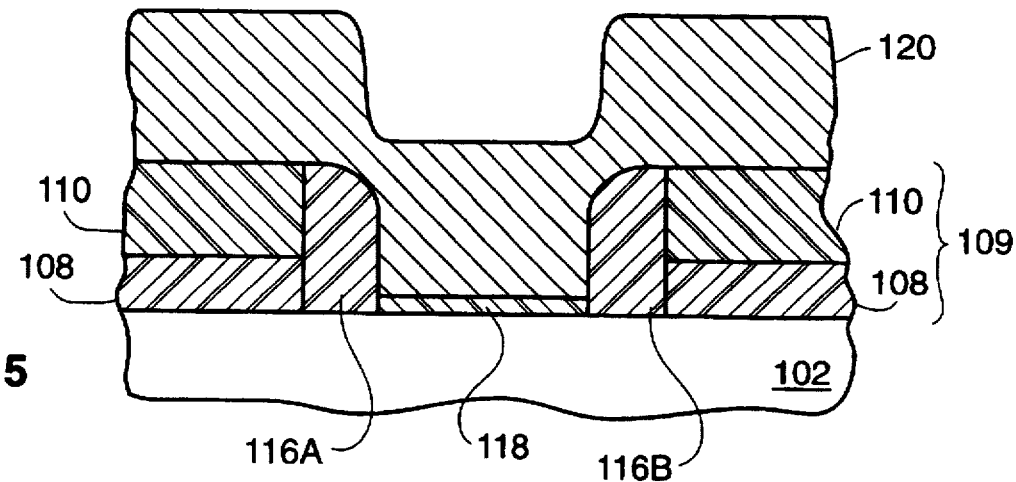
FIG. 5 is a processing step subsequent to FIG. 4 in which a gate conductive material has been blanket deposited.

Turning now to FIG. 4, gate dielectric layer 118 is formed on an upper surface of substrate 102 laterally displaced between spacer structures 116a and 116b. In a presently preferred embodiment, gate dielectric 118 is a thermally formed oxide film of approximately 2–20 nm in thickness. In FIG. 5 a gate conductive layer 120 is formed over a topology cooperatively defined by upper surfaces of dielectric stack 109, spacer structure 116, and gate dielectric layer 118. In a preferred embodiment, the formation of gate conductive layer 120 is accomplished by blanket depositing polysilicon in a chemical vapor deposition process and thereafter implanting or otherwise doping the polysilicon such that gate conductive layer 120 comprises a highly doped polysilicon film. For purposes of this disclosure, "highly doped polysilicon" is defined as polysilicon having a sheet resistance less than 500 Ω/sq. Alternatively, gate conductive layer 120 may comprise titanium nitride, titanium tungsten, or other conductive material compatible with the processing sequence hereof.

Figure 6:
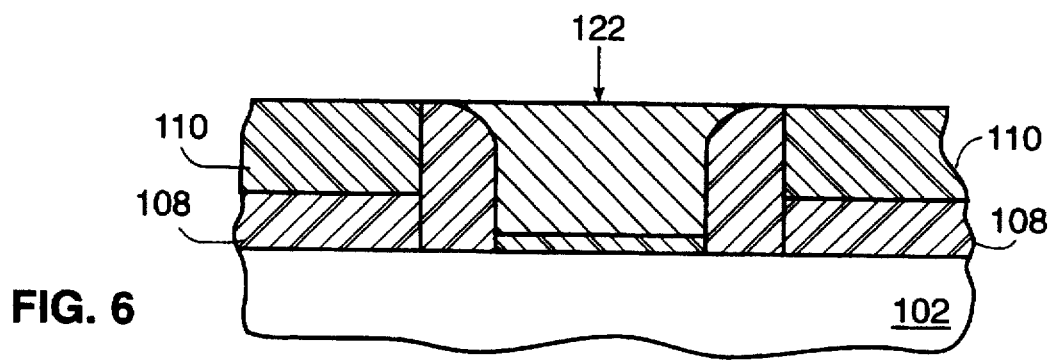
FIG. 6 is a processing step subsequent to FIG. 5 in which the gate conductive layer has been planarized.
Figure 7:
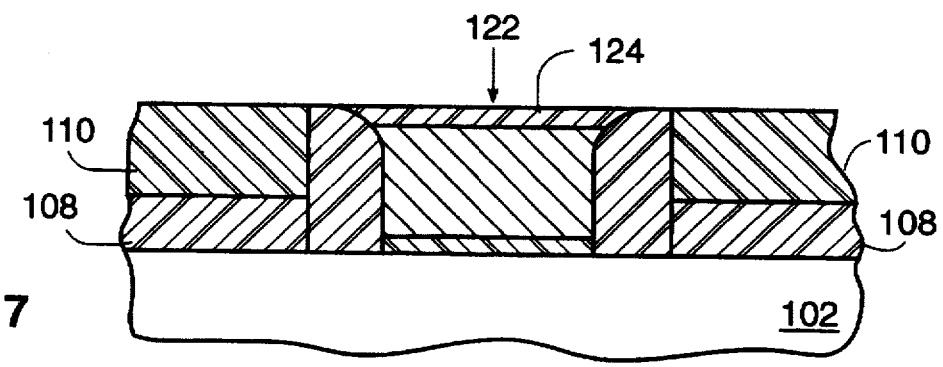
FIG. 7 is a processing step subsequent to FIG. 6 in which a thermal oxide film has been grown at an upper surface of the gate conductive layer.

Turning to FIG. 6, gate conductive layer 120 is planarized preferably with a chemical mechanical polish, possibly in combination with photomask steps and dry etch steps, to produce gate structure 122 having an upper surface that is substantially planar with an upper surface of spacer 116 and dielectric stack 109. FIG. 7 shows an optional processing step, used in conjunction with an embodiment in which gate conductive material 120 comprises heavily doped polysilicon, in which a thermal oxide film 124 is grown on an upper surface of gate structure 122. The formation of an oxide film on an upper surface of gate structure 122 is beneficial in protecting gate conductor 122 during a subsequent processing step in which silicon nitride layer 110 is removed with a wet etch process. It is understood, however, that formation of thermal oxide film 124 may be omitted in embodiments in which, for example, dielectric stack 109 is entirely comprised of oxide.

Figure 8:
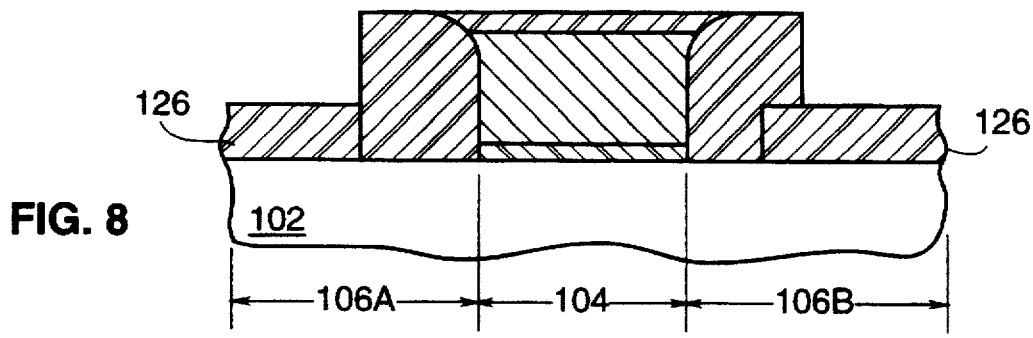
FIG. 8 is a processing step subsequent to FIG. 7 in which an upper portion of the dielectric stack has been removed.
Figure 9:
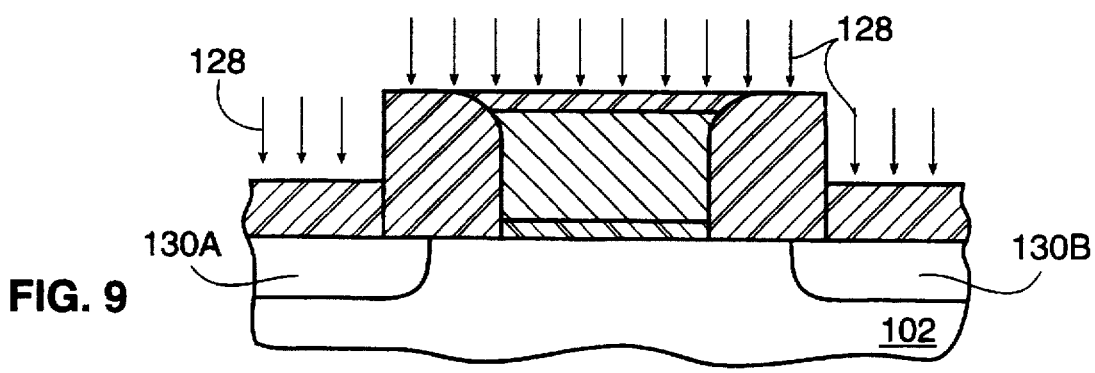
FIG. 9 is a processing step subsequent to FIG. 8 in which ions have been introduced into the pair of source/drain regions and into the gate electrode.

FIGS. 8 and 9 show a processing sequence in which LDD structures are omitted. In FIG. 8, an upper region of dielectric stack 109 is removed to form implant dielectric 126 over source/drain regions 106a and 106b. In an embodiment of the invention in which dielectric stack 109 comprises oxide layer 108 and silicon nitride layer 110, implant dielectric 126 can be formed simply by removing silicon nitride layer 110, preferably with a 85% phosphoric acid solution at approximately 120°–130° C. Turning to FIG. 9, a first concentration 130 of a first dopant 128 is introduced into the pair of source/drain regions 106a and 106b (and into the gate conductor). First dopant species 128 preferably comprises ions of boron, phosphorus, or arsenic.

Figure 10:
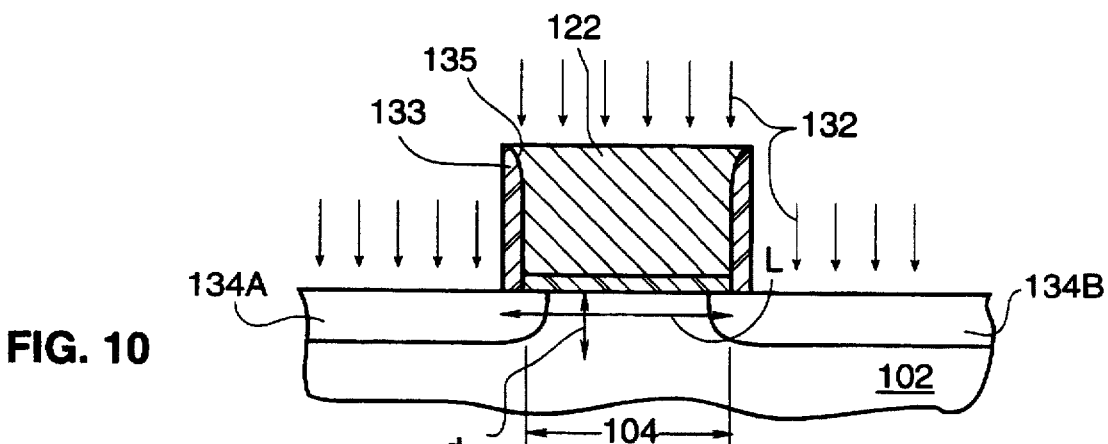
FIG. 10 is a processing step subsequent to FIG. 7 in which LDD regions have been formed in the source/drain regions of the semiconductor substrate.
Figure 11:
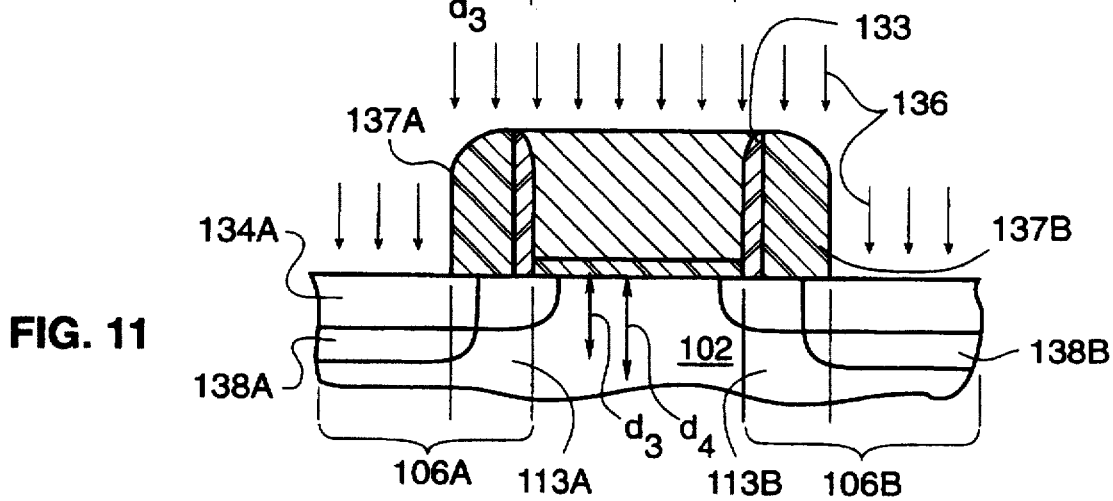
FIG. 11 is a processing step subsequent to FIG. 10 in which spacer structures have been formed on the sidewalls of the gate structure and a second concentration of ions has been introduced into the source/drain regions of the semiconductor substrate.

Turning now to FIGS. 10 and 11, a process sequence is shown for forming a transistor utilizing LDD structures. FIG. 10 shows a processing step subsequent to FIG. 7 in which dielectric stack 109 and first spacer structure 116 have been removed. In a presently preferred embodiment for use with a process sequence in which dielectric stack 109 comprises a silicon nitride film on an oxide film, removal of dielectric stack 109 and spacer structure 116 is a two-step process in which silicon nitride layer 110 is removed with a wet phosphoric etch and oxide layer 108 and spacer structure 116 are removed with a plasma oxide etch. An anisotropic etch is preferred to prevent the occurrence of a reentrant gate structure 122 which may occur if a wet oxide etch is used. As seen in FIG. 10, an anisotropic etch of spacer structures 116 may result in residual dielectric structure 133 due to a reentrant profile 135 of gate structure 122. Residual dielectric 133 is beneficial to provide a non-reentrant profile upon which a subsequent spacer structure may be formed. It is understood, however, that a wet etch, such as an HF dip, may be substituted for the plasma etch of FIG. 10. It is further understood that a wet etch process, if used, etches isotropically such that no residual dielectric 133 will remain.

After the removal of spacer structures 116 and dielectric stack 109, a first concentration 134 of a first dopant species 132 is introduced into source/drain regions 106a and 106b of semiconductor substrate 102. Preferably, first dopant species 132 comprise boron, phosphorus, or arsenic ions. First concentration 134 is preferably contained within a first depth $d_3$ below an upper surface of semiconductor substrate 102. As seen in FIG. 10, the channel length L is approximately equal to channel region 104 of semiconductor substrate 102. In a preferred embodiment, in which channel region 104 has a lateral dimension less than the minimum resolvable feature of the photolithography apparatus, the channel length L is also less than the minimum feature of the photolithography equipment. It will be appreciated to those skilled in the field of semiconductor processing, first concentration 134 comprises lightly doped drain regions. Turning to FIG. 11, second spacer structures 137a and 137b are formed on sidewalls of gate structure 122. The formation of second spacer structures 137a and 137b are substantially the same as the process described above for forming first spacer structures 116a and 116b. Second spacer structure 137a and 137b shadow peripheral regions 113a and 113b of source/drain regions 116a and 116b, respectively. Thereafter, second concentration 138a and 138b of second dopant species 136 are introduced into source/drain regions 106a and 106b, respectively. Second dopant species 136 preferably comprise phosphorus, arsenic, or boron ions as is well known in the field. Second concentrations 138 are substantially contained within a second depth $d_4$ below an upper surface of semiconductor substrate 102. In a presently preferred embodiment, second depth $d_4$ is greater than first depth $d_3$. The second concentration 138 is greater than first concentration 134.

As will be appreciated to those skilled in the art of semiconductor fabrication, the present method is useful in the formation of a transistor having a gate structure with a lateral dimension which is less than a minimum dimension resolvable by the photolithography equipment. The method is capable of producing transistors having channel lengths substantially smaller than channel lengths previously obtainable with optical aligners using conventional fabrication methods, and is therefore useful in extending the life time of the optical aligners, thereby reducing capital expenditures of the semiconductor manufacturer. Furthermore, it is to be understood that the form of the invention shown and described is to be taken as presently preferred embodiments. Various modifications and changes may be made to each and every processing step, as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor fabrication process for use with an optical aligner wherein said optical aligner is capable of resolving a minimum dimension, comprising:

providing a semiconductor substrate, wherein said semiconductor substrate includes a channel region laterally disposed between a pair of source/drain regions;

forming a dielectric stack on an upper surface of said semiconductor substrate;

patterning said dielectric stack to expose an upper surface of a spacer region of said semiconductor substrate, wherein said spacer region includes said channel region and peripheral portions of said pair of source/drain regions proximal to said channel region, and wherein said patterning produces a pair of opposing sidewalls in said dielectric stack, and further wherein a lateral separation between said opposing sidewalls is approximately equal to said minimum dimension of said optical aligner;

forming a pair of first spacer structures on said pair of opposing sidewalls respectively such that said pair of first spacer structures shadow said peripheral portions of said pair of source/drain regions and such that an upper surface of said channel region of said semiconductor substrate is exposed whereby a lateral dimension of said exposed channel region is less than said minimum dimension of said optical aligner;

forming a gate structure on said upper surface of said channel region of said semiconductor substrate, wherein said gate structure is laterally disposed between said pair of first spacer structures;

removing said dielectric stack from upon said upper surface of said semiconductor substrate, thereby exposing a portion of said pair of source/drain regions;

removing said pair of first spacers from said sidewalls of said gate structure; and after removing said dielectric stack and said pair of first spacers, implanting a first concentration of ions into said pair of source/drain regions before any other source/drain implants are performed such that said first concentration is self aligned to said gate structure to form a transistor, whereby a channel length of said transistor is less than a minimum feature size of said optical aligner, and wherein said first concentration is substantially contained above a first depth below said upper surface of said semiconductor substrate.

2. The process of claim 1 wherein the step of forming said dielectric stack comprises forming an oxide layer on an upper surface of said semiconductor substrate.

3. The process of claim 2 wherein the step of forming said dielectric stack further comprises depositing a silicon nitride layer on said oxide layer.

4. The process of claim 1 wherein the step of patterning said dielectric stack comprises:

depositing a photoresist layer on said dielectric stack;

selectively exposing said photoresist layer with said optical aligner such that an exposed region is formed in said photoresist layer laterally displaced between first and second unexposed regions, wherein said exposed region has a lateral dimension approximately equal to said minimum dimension of said optical aligner, and further wherein said exposed region is laterally aligned with said spacer region;

removing said exposed region of said photoresist layer to expose an upper surface of said dielectric stack;

removing portions of said dielectric stack within said spacer region such that opposing sidewalls of said dielectric stack are formed and such that an upper surface of said spacer region of said semiconductor substrate is exposed.

5. The process of claim 1 wherein the step of forming said pair of first spacer structures comprises:

depositing a substantially conformal spacer material on a topology cooperatively defined by upper surfaces of said dielectric stack and said semiconductor substrate; and anisotropically etching said spacer material to clear said spacer material over planar regions of said dielectric stack with minimum overetch.

6. The process of claim 5 wherein said substantially conformal spacer material comprises CVD oxide formed from a TEOS source.

7. The process of claim 1 wherein the step of forming said gate structure comprises:

forming a gate dielectric on an upper surface of said semiconductor substrate, wherein said gate dielectric layer is laterally disposed between said pair of first spacer structures;

depositing a gate conductive layer on a topology cooperatively defined by upper surfaces of said dielectric stack, said pair of first spacer structures, and said gate dielectric; and planarizing said gate conductive layer such than an upper surface of said gate conductive layer is substantially coplanar with an upper surface of said dielectric stack.

8. The process of claim 7 wherein said gate conductive layer comprises doped polysilicon having a sheet resistivity less than 500 Ω/square.

9. The process of claim 8 further comprising thermally oxidizing said gate conductive layer such that a thermal oxide film is formed at an upper surface of said conductive gate layer.

10. The process of claim 7 wherein the step of planarizing said gate conductive layer comprises chemical mechanical polishing.

11. The process of claim 1, further comprising, after said implanting a first concentration,:

forming a pair of second spacer structures on said sidewalls of said gate structure such that said pair of second spacer structures shadow peripheral portions of said pair of source/drain regions; and implanting a second concentration of ions into said pair of source/drain regions, wherein said second concentration is substantially contained above a second depth below said upper surface of said semiconductor substrate.

12. The process of claim 11, wherein said second depth is greater than said first depth and said second concentration is greater than said first concentration.

13. The process of claim 1, wherein the step of removing said first spacer structures comprises a plasma etch process.

14. The process of claim 1, wherein the step of removing said first spacer structures comprises a wet etch process.

15. A process for making a semiconductor transistor, comprising:

providing a semiconductor substrate, wherein said semiconductor substrate includes a channel region laterally disposed between first and second source/drain regions;

forming a dielectric stack on an upper surface of said semiconductor substrate by depositing oxynitride on said silicon substrate;

depositing a photoresist layer on said dielectric stack;

providing an optical aligner, wherein said optical aligner is capable of resolving a feature having a minimum dimension;

selectively exposing said photoresist layer with said optical aligner such that an exposed region is formed in said photoresist layer, wherein said exposed region has a lateral dimension approximately equal to said minimum dimension of said optical aligner, and further wherein said exposed region is laterally aligned with boundaries of a spacer region of said semiconductor substrate, said spacer region including said channel region and peripheral portions of said first and second source/drain regions;

removing said exposed region of said photoresist layer to expose an upper surface of said dielectric stack;

removing portions of said dielectric stack within lateral boundaries of said spacer region such that opposing sidewalls of said dielectric stack are formed and such that an upper surface of said spacer region of said semiconductor substrate are exposed and;

forming a pair of first spacer structures on said opposing sidewalls respectively such that said pair of first spacer structures shadows said peripheral portions of said first and second source/drain regions and such that an upper surface of said channel region of said semiconductor substrate is exposed;

forming a gate structure on said upper surface of said channel region of said semiconductor substrate, wherein said gate structure is laterally disposed between said pair of first spacer structures, said gate structure having a lateral dimension less than said minimum dimension of said optical aligner; and introducing a first dopant species into said first and second source/drain regions of said semiconductor substrate.

16. A semiconductor fabrication process, comprising:

providing a semiconductor substrate, wherein said semiconductor substrate includes a channel region laterally disposed between a pair of source/drain regions;

forming a first masking layer directly upon said semiconductor substrate;

depositing a second masking layer directly upon said first masking layer, wherein said first masking layer and said second masking layer form a dielectric stack upon said substrate;

patterning said dielectric stack to expose an upper surface of a spacer region of said semiconductor substrate, wherein said spacer region includes said channel region and peripheral portions of said pair of source/drain regions proximal to said channel region, and further wherein said patterning produces a pair of opposing sidewalls in said dielectric stack;

forming a pair of spacer structures on said pair of opposing sidewalls respectively such that said pair of first spacer structures shadow said peripheral portions of said pair of source/drain regions and such that an upper surface of said channel region of said semiconductor substrate is exposed;

forming a gate structure on said upper surface of said channel region of said semiconductor substrate, wherein said gate structure is laterally disposed between said pair of spacer structures;

removing said second masking layer from upon said first masking layer; and subsequent to removing said second masking layer, and while retaining said first masking layer and said pair of spacer structures upon said substrate, introducing a first dopant species into said pair of source/drain regions.

17. The process of claim 16, wherein said first masking layer comprises an oxide layer.

18. The process of claim 16, wherein said second masking layer comprises a silicon nitride layer.

* * * * *